US012757510B2

(12) United States Patent
Phan et al.

(10) Patent No.: US 12,757,510 B2
(45) Date of Patent: Oct. 6, 2026

(54) IMAGE SENSOR WITH OPTICAL STRUCTURE FOR FLARE REDUCTION

(71) Applicant: OMNIVISION TECHNOLOGIES, INC., Santa Clara, CA (US)

(72) Inventors: Bill Phan, Sunnyvale, CA (US); Duli Mao, Sunnyvale, CA (US); Seong Yeol Mun, Santa Clara, CA (US)

(73) Assignee: OMNIVISION TECHNOLOGIES, INC., Santa Clara, CA (US)

(*) Notice: Subject to any disclaimer, the term of this patent is extended or adjusted under 35 U.S.C. 154(b) by 460 days.

(21) Appl. No.: 18/461,320

(22) Filed: Sep. 5, 2023

(65) Prior Publication Data

US 2025/0081656 A1 Mar. 6, 2025

(51) Int. Cl.

*H10F 39/00* (2025.01)
*H10F 39/12* (2025.01)
*H10F 39/18* (2025.01)

(52) U.S. Cl.

CPC ........... *H10F 39/806* (2025.01); *H10F 39/12* (2025.01); *H10F 39/18* (2025.01); *H10F 39/8053* (2025.01); *H10F 39/8057* (2025.01); *H10F 39/8067* (2025.01); *H10F 39/8063* (2025.01); *H10F 39/811* (2025.01)

(58) Field of Classification Search

CPC ........ H10F 39/014; H10F 39/12; H10F 39/18; H10F 39/1515; H10F 39/8057–8067

See application file for complete search history.

(56) References Cited

U.S. PATENT DOCUMENTS

| | | | | |
|---|---|---|---|---|
| 11,217,613 | B2 | 1/2022 | Phan et al. | |
| 2020/0058809 | A1* | 2/2020 | Mizuta | H10F 77/241 |
| 2022/0077203 | A1* | 3/2022 | Ootsuka | H10F 39/8063 |
| 2022/0123041 | A1* | 4/2022 | Watanabe | H10F 39/182 |
| 2023/0215893 | A1* | 7/2023 | Sekine | H10F 39/8057 257/292 |

FOREIGN PATENT DOCUMENTS

| | | | | |
|---|---|---|---|---|
| CN | 116153954 A | * | 5/2023 | H10W 42/60 |

* cited by examiner

*Primary Examiner* — Christine S. Kim
*Assistant Examiner* — Tien Tran
(74) *Attorney, Agent, or Firm* — Christensen O'Connor Johnson Kindness PLLC

(57) ABSTRACT

An image sensor is described. The image sensor comprises a plurality of pixels arranged to form an active pixel array, a plurality of contact pads disposed within a peripheral region of the image sensor that surrounds the active pixel array, and an optical structure disposed within the peripheral region between the plurality of contact pads and the active pixel array. The optical structure is adapted to mitigate stray light from reaching the active pixel array.

19 Claims, 10 Drawing Sheets

400

IMAGE SENSOR WITH OPTICAL STRUCTURE FOR FLARE REDUCTION

TECHNICAL FIELD

This disclosure relates generally to image sensors, and in particular but not exclusively, relates to complementary metal-oxide-semiconductor image sensors.

BACKGROUND INFORMATION

Image sensors are one type of semiconductor device that have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, size, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is readout as analog image signals from the column bit lines and converted to digital values to produce digital images (i.e., image data) representative of the external scene.

However, performance of the image sensor may be negatively impacted by stray light that may inadvertently be incident upon the array of pixels having photosensitive elements. Stray light corresponds to unintended light that is incident upon the array of pixels, which may affect the amount of image charge generated and thus cause one or more imaging artifacts such as flare. Flare in particular is due to internal reflections within an image sensor or lens package that may degrade the quality of images generated by an image sensor or otherwise result in a given image not accurately representing an external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale; emphasis instead being placed upon illustrating the principles being described.

DETAILED DESCRIPTION

Figure 1A:
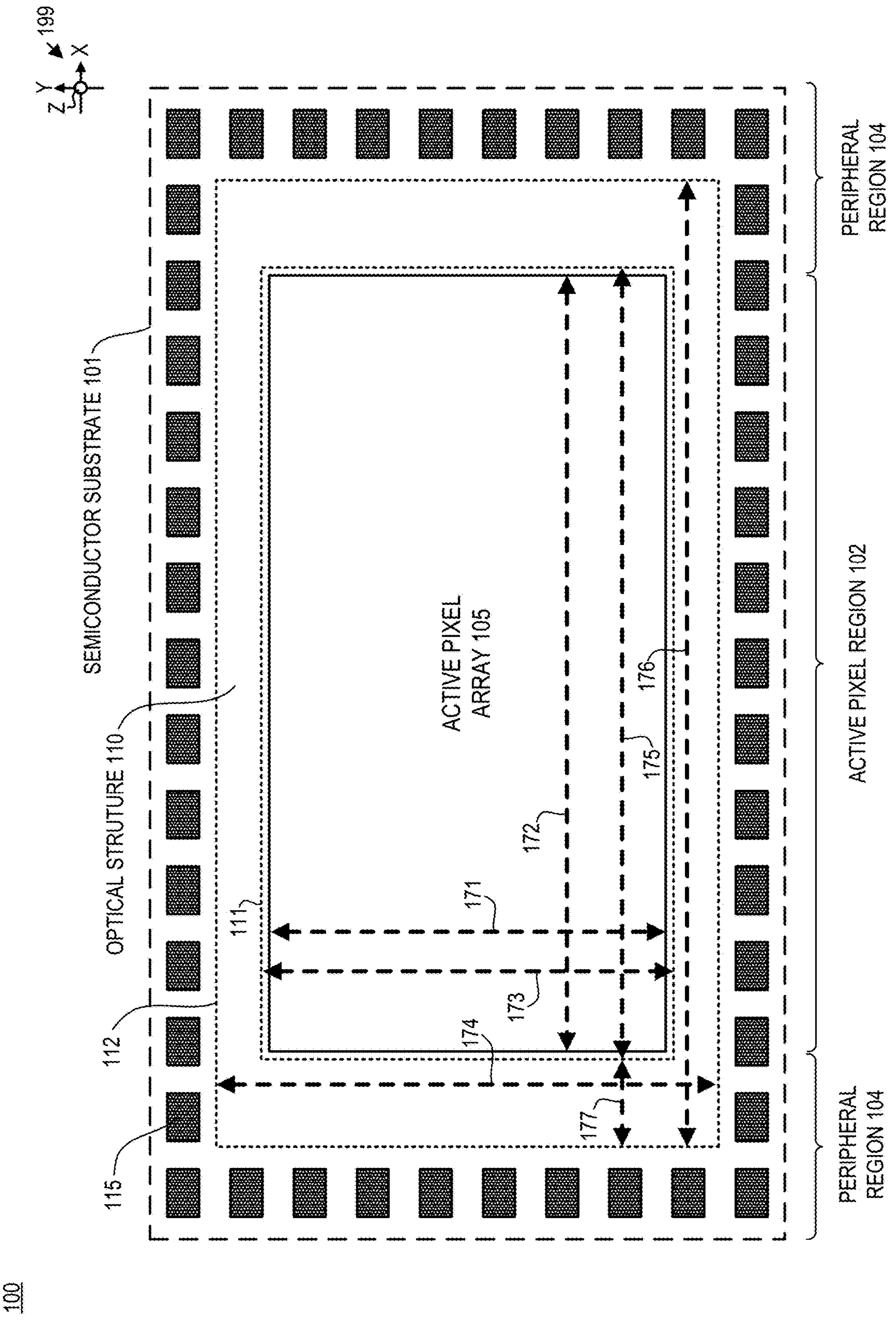
FIG. 1A illustrates a top view of an example of an image sensor with an optical structure adapted to mitigate stray light from reaching an active pixel array of the image sensor, in accordance with embodiments of the disclosure.

Embodiments of an apparatus, system, and/or method related to an image sensor with an optical structure for flare reduction are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Described herein are embodiments of an image sensor having an optical structure to mitigate stray light. In some embodiments, the image sensor will have an active pixel array (e.g., including a plurality of photodiodes to photogenerate image charge in response to incident light) surrounded by a peripheral region of the image sensor. It was found that in image sensors having a metal shield and a transparent cover extending within the peripheral region, stray light may be reflected within the peripheral region between the metal shield and the transparent cover and be incident upon the active pixel array resulting in image quality degradation or other artifacts such as flare. To mitigate the stray light from being incident upon the active pixel array, the optical structure is configured to be disposed between the transparent cover and the metal shield within the peripheral region to reduce reflections. More specifically, the optical structure may function as a light trapping structure that traps or otherwise redirects the stray light to be disposed between the optical structure and the metal shield (e.g., to prevent a cascading effect where the stray light reflects between the metal shield and the transparent cover until the stray light propagates towards or is otherwise incident upon the active pixel array). In some embodiments, the optical structure causes the stray light to be reflected and scattered or trapped between the optical structure and the metal shield until the stray light can be absorbed, attenuated, or otherwise directed away from the active pixel array. It was found that in some embodiments, the optical structure may result in up to a four to five-fold reduction in reflection at the surface of the image sensor (e.g., in terms of percent of stray light reflected from the peripheral region).

FIG. 1A illustrates a top view of an example of an image sensor 100 with an optical structure 110 adapted to mitigate stray light from reaching an active pixel array 105 of the image sensor 100, in accordance with embodiments of the disclosure. The image sensor 100 includes an active pixel region 102 and a peripheral region 104 laterally (e.g., when the image sensor 100 is viewed about the x-y plane of coordinate system 199) surrounding the active pixel region 102. The active pixel region 102 of the image sensor 100 includes active pixel array 105 formed in or on semiconductor substrate 101. It is appreciated that in some embodiments dimensions of the active pixel region 102 are defined, at least in part, by the active pixel array 105 such that the active pixel region 102 includes an entirety of the active pixel array 105. The peripheral region 104 of the image sensor 100 includes optical structure 110 and plurality of contact pads 115, each formed in or on the semiconductor substrate 101. It is appreciated that the view presented in FIG. 1A may omit certain features of the image sensor 100 to avoid obscuring details of the disclosure. In other words, not all elements of the image sensor 100 may be labeled, illustrated, or otherwise shown within FIG. 1A or other figures throughout the disclosure. It is further appreciated that in some embodiments, the image sensor 100 may not necessarily include all elements shown.

Figure 2A:
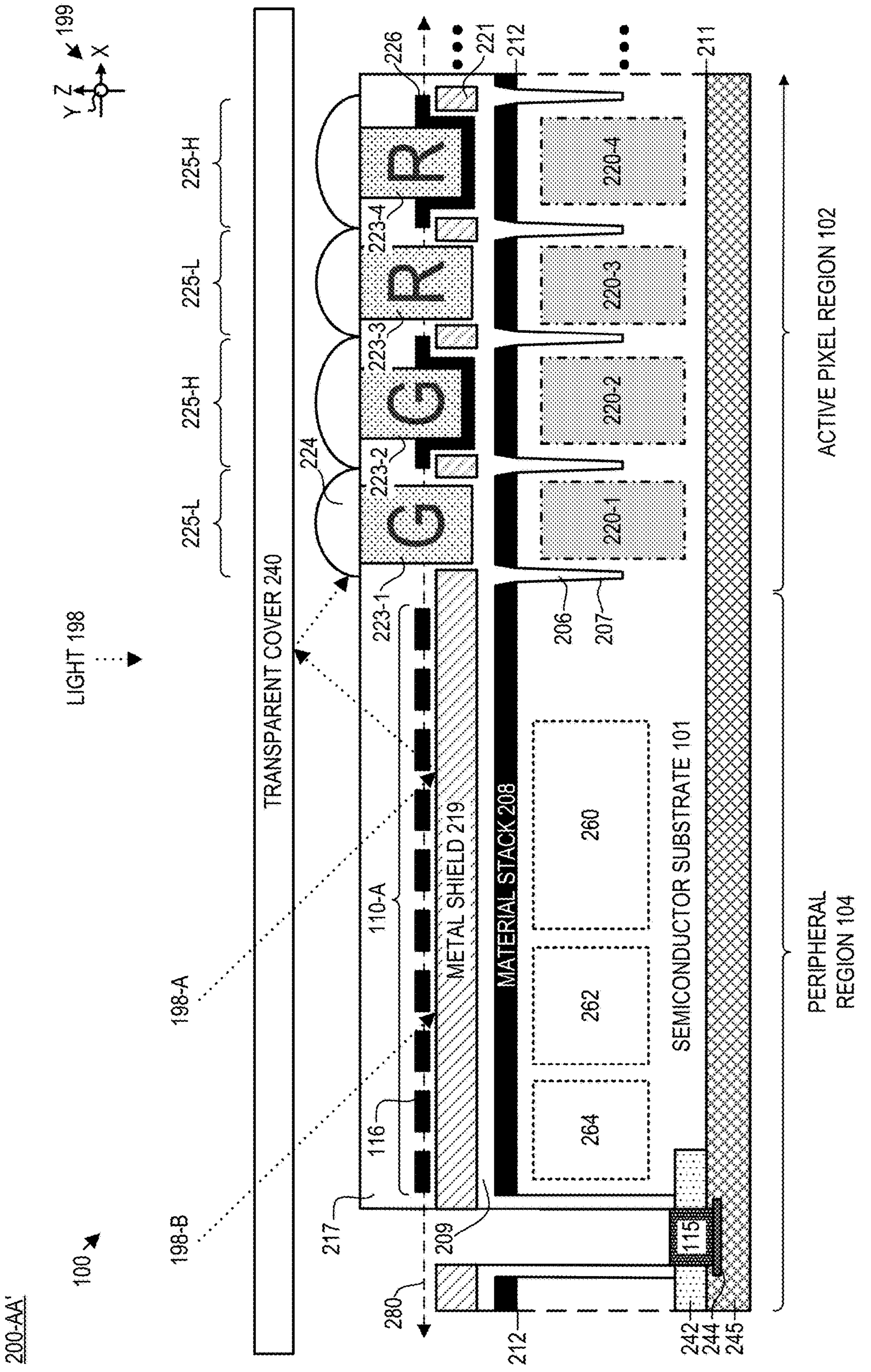
FIG. 2A illustrates a cross-sectional view along the line A-A' of the image sensor illustrated in FIG. 1B, in accordance with an embodiment of the disclosure.

The active pixel array 105 of the image sensor 100 includes a plurality of pixels (see, e.g., plurality of pixels 225 illustrated in FIG. 2A). The plurality of pixels included in the active pixel array 105 includes, inter alia, a plurality of photodiodes (see, e.g., plurality of photodiodes 220 illustrated in FIG. 2A) to configure the active pixel array 105 to generate image charge in response to incident light to be read out and processed to form an image (e.g., to generate a digital image representative of a scene external to the image sensor 100). It is appreciated that the plurality of photodiodes (e.g., pinned photodiodes) are formed or otherwise disposed within the semiconductor substrate 101.

In the illustrated embodiment, the semiconductor substrate 101 may correspond to a part of or an entirety of a semiconductor wafer (e.g., a silicon wafer). In some embodiments, the semiconductor substrate 101 includes or is otherwise formed of silicon, a silicon germanium alloy, germanium, a silicon carbide alloy, an indium gallium arsenide alloy, any other alloys formed of III-V group compounds, combinations thereof, one or more epitaxial layers of the aforementioned materials, or a bulk substrate thereof. More specifically, the semiconductor substrate 101 may correspond to any semiconductor material or combination of materials that may be doped or otherwise configured to include the plurality of photodiodes of the active pixel array 105 of the image sensor 100. For example, in some embodiments, the semiconductor substrate 101 may correspond to one or more epitaxial layers (e.g., P or N doped silicon) formed on a carrier wafer. In such an embodiment, the plurality of photodiodes of the active pixel array 105 may be formed in the one or more epitaxial layers corresponding to the semiconductor substrate 101 while the carrier wafer may be removed or otherwise thinned during fabrication. In one embodiment, the semiconductor substrate 101 is formed of intrinsic or extrinsic silicon having regions doped sufficiently to form the plurality of photodiodes of the active pixel array 105.

The optical structure 110 is disposed within the peripheral region 104 of the image sensor 100 between the plurality of contact pads 115 and the active pixel array 105. In some embodiments, the optical structure 110 laterally surrounds the active pixel array 105 when the image sensor 100 is viewed from a top view. The optical structure is adapted or otherwise configured to mitigate stray light from reaching the active pixel array 105. Stray light corresponds to light that is incident upon the image sensor 100 but is not directly incident upon the active pixel array 105 (e.g., light that is incident upon the peripheral region 104 of the image sensor 100). As will be discussed later in more detail, stray light may propagate (e.g., via reflection or otherwise) from the peripheral region 104 towards the active pixel region 102, which may result in various artifacts (e.g., flare) that may degrade the quality of images generated by the image sensor 100. The optical structure 110 is configured to mitigate the stray light from reaching the active pixel region 102 and the active pixel array 105 by redirecting the stray light away from the active pixel region 102 and the active pixel array 105 via scattering, refraction, reflection, absorption, or combinations thereof. In some embodiments, a configuration of the optical structure 110 in combination with a metal shield (see, e.g., metal shield 219 illustrated in FIG. 2A) and low-refractive-index material (see, e.g., low-refractive-index material 217 illustrated in FIG. 2A and FIG. 2B) included in the image sensor 100 may collectively function as a light trapping structure that causes stray light to be reflected and scattered or trapped between the optical structure 110 and the metal shield until the stray light can be absorbed, attenuated, or otherwise directed away from the active pixel region 102.

Figure 2B:
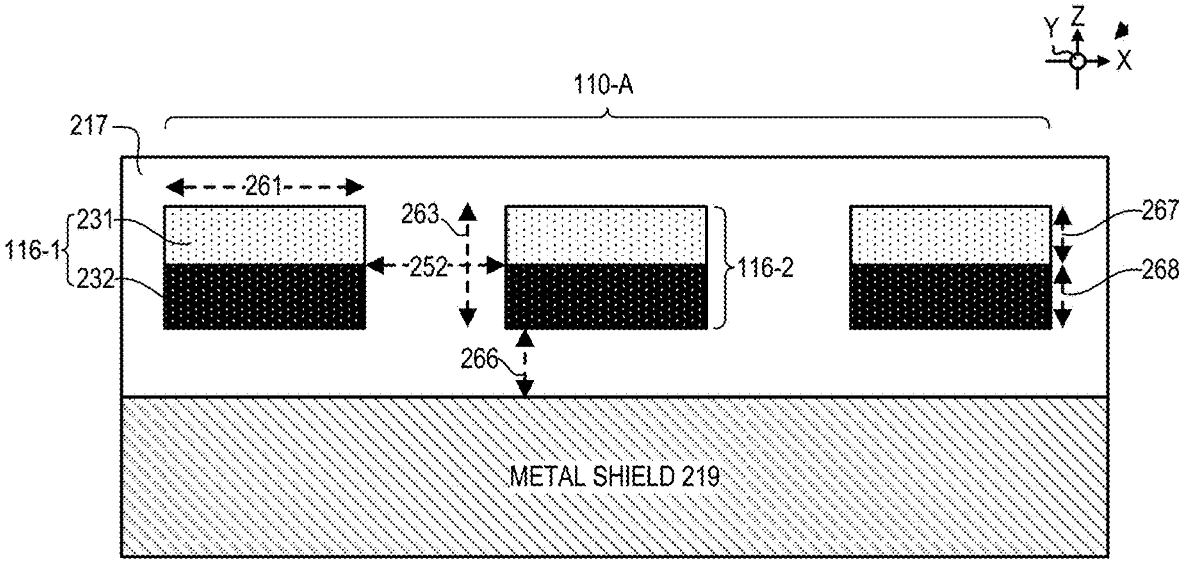
FIG. 2B illustrates a more detailed view of the optical structure illustrated in FIG. 2A, in accordance with an embodiment of the disclosure.

It is appreciated that the optical structure 110 includes one or more materials (e.g., a first material, a second material, and so on). The one or more materials may include titanium nitride, titanium, other metals, other metal nitrides, other metal oxides, or combinations thereof. In some embodiments, the one or more materials of the optical structure 110 form homogeneous layers (e.g., a first layer of the first material, a second layer of the second material, and so on as illustrated in FIG. 2A and FIG. 2B) that are stacked together to form a multi-layer stacked structure. In the same or other embodiments, the optical structure 110 may more generally be described as being segmented to form a plurality of regions of a first material (or combination of materials such as the second material or other or additional materials included in the multi-layer stacked structure) separated by the low-refractive-index material. In some embodiments, the plurality of regions of the first material have a first refractive index greater than a corresponding refractive index of the low-refractive-index material but less than a metal refractive index of a metal included in the metal shield (see, e.g., FIG. 2B). In some embodiments, the optical structure 110 is disposed proximate to the metal shield (e.g., metal shield 219 disposed within the peripheral region 104 proximate to a first side 212 of the semiconductor substrate 101). More specifically, in some embodiments, the metal shield is disposed between the first side of the semiconductor substrate 101 and the optical structure 110 (e.g., both the metal shield and the optical structure 110 extend parallel to each other and the x-y plane of coordinate system 199 as illustrated in FIG. 2A).

In the illustrated embodiment, one or more dimensions of the optical structure 110 are configured to be greater than corresponding dimensions of the active pixel array 105. For example, the optical structure 110 is defined by an inner boundary 111 and an outer boundary 112 that are both disposed between the active pixel array 105 and the plurality of contact pads 115. As illustrated in FIG. 1A, an inner width 173 (extending parallel to the y-direction of coordinate system 199) as defined by the inner boundary 111 of the optical structure 110 and an outer width 174 (extending parallel to the y-direction of coordinate system 199) as defined by the outer boundary 112 of the optical structure 110 are each greater than a width 171 (extending parallel to the y-direction of coordinate system 199) of the active pixel array 105. Similarly, an inner length 175 (extending parallel to the x-direction of coordinate system 199) as defined by the inner boundary 111 of the optical structure 110 and an outer length 176 (extending parallel to the x-direction of coordinate system 199) as defined by the outer boundary 112 of the optical structure 110 are each greater than a length 172 (extending parallel to the x-direction of coordinate system 199) of the active pixel array 105. In the same or other embodiments, the optical structure 110 is a monolithic structure (see, e.g., FIG. 1C and FIG. 1D) having a first dimension (e.g., inner width 173, outer width 174, inner length 175, or outer length 176) greater than a second dimension (e.g., width 171 or length 172) of the active pixel array 105. It is appreciated that in some embodiments, the first dimension and the second dimension extend along a common direction or are otherwise parallel to each other. It is appreciated that the inner width 173 and inner length 175 may be the same or different. Similarly, the outer width 174 and the outer length 176 may be the same or different.

In some embodiments, a distance between the active pixel array 105 and the plurality of contact pads 115 (e.g., a width of the optical structure 110) corresponds to optical structure width 177. In some embodiments, optical structure width 177 is at least 600 μm or greater to provide sufficient space for stray light to be mitigated within the peripheral region 104 of the image sensor 100. In some embodiments, the optical structure width 177 may be constant. In other embodiments, the optical structure width 177 changes (e.g., minimum distance the optical structure extends is different in the x-direction and y-direction of the coordinate system 199). It is appreciated that in some embodiments, the image sensor 100 illustrated in FIG. 1A may not necessarily be drawn to scale as one or more components may be disposed in or on the semiconductor substrate 101 within the peripheral region 104 but between the optical structure 110 and the active pixel array 105 (e.g., one or more photodiodes associated with an optical black pixel reference array and/or dummy array as illustrated in FIG. 2A).

In the illustrated embodiment, the plurality of contact pads 115 are disposed within the peripheral region 104 of the image sensor 100 and may provide external signal connections (e.g., between image sensor 100 and a host or an image processor). In some embodiments, the plurality of contact pads 115 laterally surrounds the optical structure 110. The plurality of contact pads 115 may include one or more conductive metals (e.g., metals such as Al, Au, Cu, other metals, metal alloys, polycrystalline silicon, other conductive materials, or combinations thereof) to facilitate an electrical connection to one or more metal layers included in a metallization region of the image sensor 100 (e.g., a back end of the line portion of the image sensor 100 that facilitates connections between components of the image sensor 100).

Figure 1B:
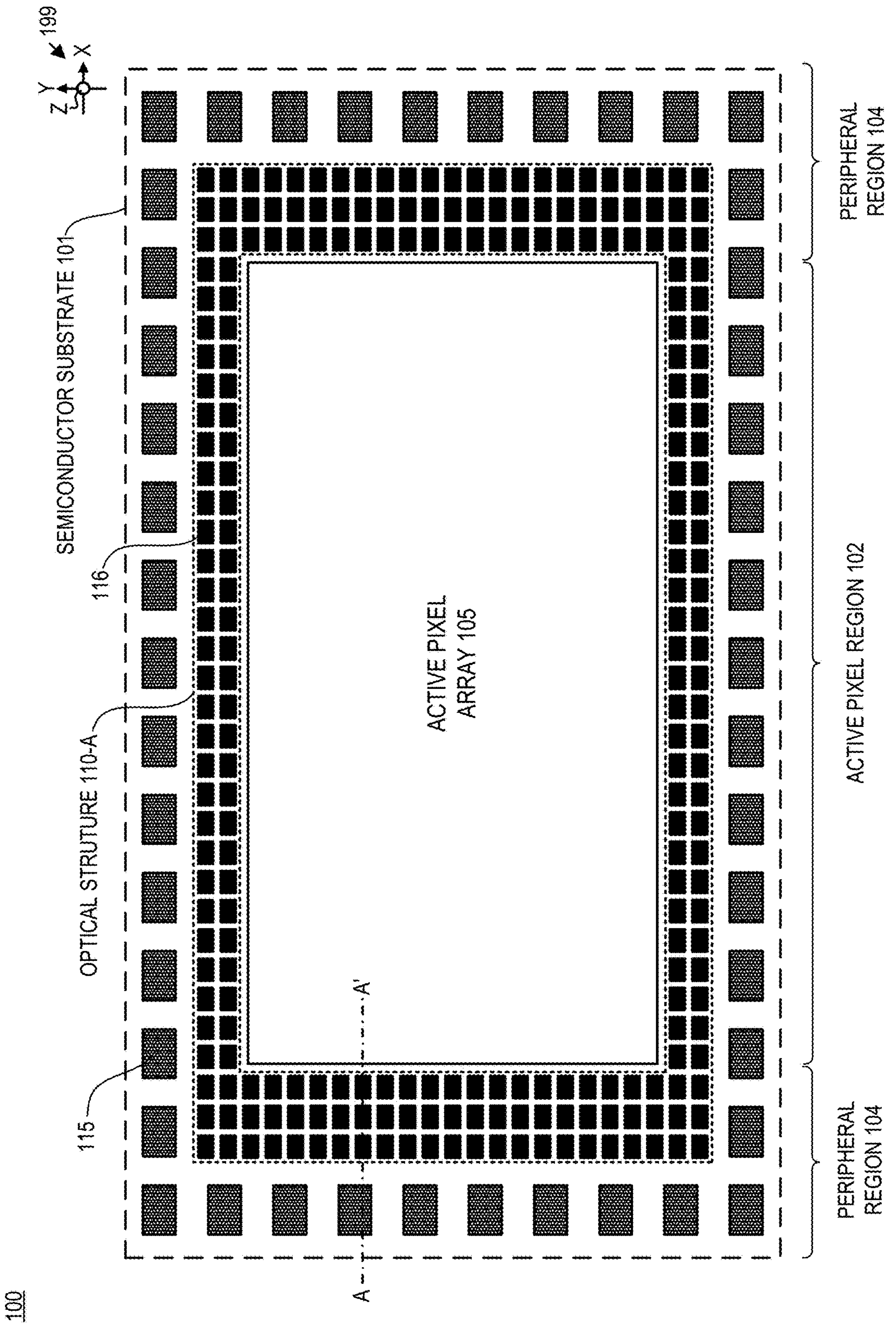
FIG. 1B illustrates optical structure, which is one possible implementation of the optical structure of the image sensor 100 illustrated in FIG. 1A, in accordance with an embodiment of the disclosure.

FIG. 1B illustrates optical structure 110-A, which is one possible implementation of the optical structure 110 of the image sensor 100 illustrated in FIG. 1A, in accordance with an embodiment of the disclosure. Accordingly, the optical structure 110-A of FIG. 1B may include the same or similar features of the optical structure 110 of FIG. 1A (e.g., overall dimensions, relative location with respect to other components of the image sensor 100, composition, function, and the like).

In the illustrated embodiment, the optical structure 110-A includes a plurality of islands 116 that are disposed within the peripheral region 104 and collectively surrounds the active pixel array 105. More specifically, the plurality of islands 116 are arranged in rows and columns and further positions to laterally (e.g., when the image sensor 100 is viewed from the x-y plane of coordinate system 199) surround, at least in part, the active pixel array 105. It is appreciated that dimensions (e.g., length, width) of individual islands included in the plurality of islands 116 are less than that of dimensions of the active pixel array 105 (e.g., width 171 and length 172 of active pixel array 105 illustrated in FIG. 1A) while collective dimensions of the optical structure 110-A (e.g., inner width 173, outer width 174, inner length 175, or outer length 176 of FIG. 1A) are still greater than the dimensions of the active pixel array 105. In some embodiments, the individual islands included in the plurality of islands may be square or rectangle shaped (e.g., lateral dimensions of 0.15 μm×0.15 μm, 0.20 μm×0.20 μm, 0.25 μm×0.25 μm, 0.30 μm×0.30 μm, 0.5 μm×0.5 μm, or other dimensions). Accordingly, in some embodiments, individual islands included in the plurality of islands 116 may have a width (e.g., measured along a direction of y-axis of coordinate system 199) from 0.10 μm to 1.00 μm and a length (e.g., measured along a direction of x-axis of coordinate system 199) from 0.10 μm to 1.00 μm.

In some embodiments, adjacent islands included in the plurality of islands 116 are separated from one another by the low-refractive-index material (see, e.g., first island 116-1 adjacent to second island 116-2 separated from one another by low-refractive-index material 217 illustrated in FIG. 2B). The separation distance between the adjacent islands included in the plurality of islands 116 may be uniform or different. In some embodiments, the separation distance between the adjacent islands is uniform and further optimized to mitigate stray light having a pre-determined angle of incidence (e.g., 30° or larger incident angle) with respect to a normal to the surface of the image sensor 100.

As illustrated in FIG. 1B, the individual islands included in the plurality of islands 116 each share a common shape (e.g., rectangle or square as illustrated or other shapes such as circle, ellipse, triangle, pentagon, hexagon, octagon, any other regular or irregular polygon, or other closed shapes) and are uniformly separated from adjacent islands. However, in other embodiments, the plurality of islands 116 may have different shapes (e.g., rectangle or square as illustrated or other shapes such as circle, ellipse, triangle, pentagon, hexagon, octagon, any other regular or irregular polygon, other closed shapes, or combinations thereof) and/or have non-uniform separation distances between adjacent islands included in the plurality of islands 116.

Figure 1C:
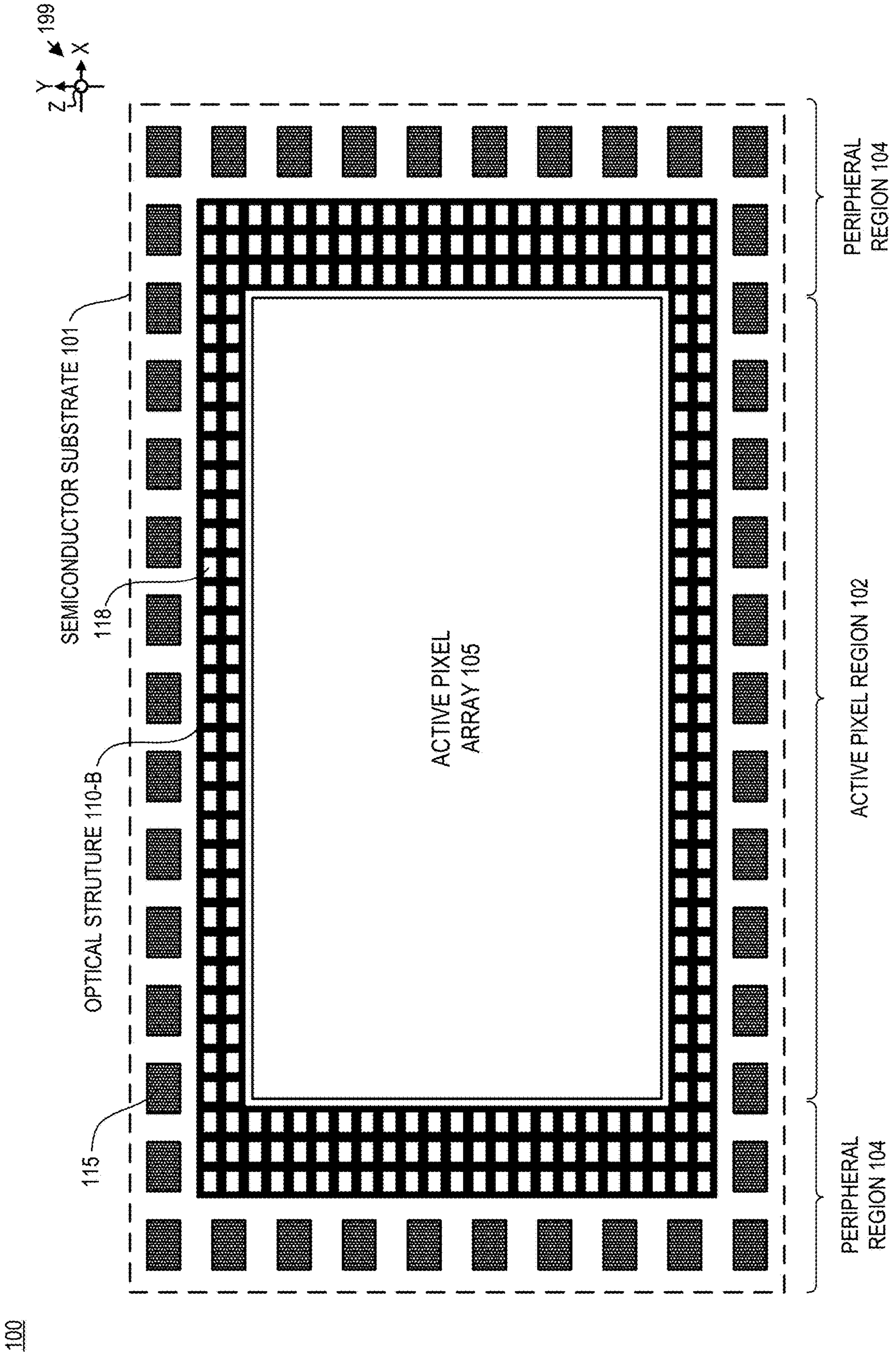
FIG. 1C illustrates optical structure, which is one possible implementation of the optical structure of the image sensor illustrated in FIG. 1A, in accordance with an embodiment of the disclosure.

FIG. 1C illustrates optical structure 110-B, which is one possible implementation of the optical structure 110 of the image sensor 100 illustrated in FIG. 1A, in accordance with an embodiment of the disclosure. Accordingly, the optical structure 110-B of FIG. 1C may include the same or similar features of the optical structure 110 of FIG. 1A (e.g., overall dimensions, relative location with respect to other components of the image sensor 100, composition, function, and the like).

In the illustrated embodiment, the optical structure 110-B is a monolithic structure patterned to form a plurality of openings 118. Each opening included in the plurality of openings 118 is filled with a low-refractive-index material (e.g., the low-refractive-index material 217 illustrated in FIG. 2B) to form a plurality of islands that are laterally surrounded by the one or more materials of the optical structure 110-B. More specifically, the optical structure is segmented to form regions of one or more materials (e.g., the first material, the second material, and so on) separated by individual islands of the low-refractive-index material included in the plurality of islands. It is appreciated that the optical structure 110-B of FIG. 1C may be considered related to the optical structure 110-A of FIG. 1B. In particular, the optical structure 110-B may have an inverse pattern to that of optical structure 110-A. Accordingly, the plurality of openings 118 of the optical structure 110-B may have the same or similar features (e.g., in terms of shape, size, or arrangement) as the plurality of islands 116 of the optical structure 110-A. In other words, both optical structure 110-A and optical structure 110-B are each segmented or otherwise patterned to form a plurality of regions of a first material (e.g., included in black-colored regions within the optical structures 110-A illustrated in FIG. 1B and 110-B illustrated in FIG. 1C) separated by a low-refractive-index material (e.g., white-colored regions within the optical structures 110-A illustrated in FIG. 1B and 110-B illustrated in FIG. 1C) to configure the optical structures 110-A, 110-B to mitigate stray light from reaching the active pixel array 105. In some embodiments, the separation distance between segments may be optimized to mitigate stray light of a particular angle of incidence upon the image sensor 100.

In some embodiments, the optical structure 110-B of FIG. 1C is a monolithic structure (e.g., is formed from a single, contiguous shape or block) having a first dimension (e.g., inner width 173, outer width 174, inner length 175, or outer length 176 as labeled in FIG. 1A) greater than a second dimension (e.g., width 171 or length 172 as labeled in FIG. 1A) of the active pixel array 105. It is appreciated that in some embodiments, the first dimension and the second dimension extend along a common direction or are otherwise parallel to each other. It is further appreciated that in some embodiments, a first material (e.g., included in the black-colored region within the optical structure 110-B illustrated in FIG. 1C) having a first refractive index is greater than a corresponding refractive index of the low-refractive-index material (e.g., included in the white-colored regions within the optical structure 110-B illustrated in FIG. 1C). Additionally, it is appreciated that individual openings included in the plurality of openings 118 of the optical structure 110-B may have a common shape (e.g., rectangle or square as illustrated or other shapes such as circle, ellipse, triangle, pentagon, hexagon, octagon, any other regular or irregular polygon, or other closed shapes as similarly described for the plurality of islands 116 of the optical structure 110-A illustrated in FIG. 1B) and are uniformly separated from adjacent openings included in the optical structure 110-B. However, in other embodiments, the plurality of openings 118 may have different shapes (e.g., rectangle or square as illustrated or other shapes such as circle, ellipse, triangle, pentagon, hexagon, octagon, any other regular or irregular polygon, other closed shapes, or combinations thereof) and/or have non-uniform separation distances between adjacent openings included in the plurality of openings 118.

It is appreciated that one distinction between the optical structure 110-A of FIG. 1B and the optical structure 110-B of FIG. 1C is that optical structure 110-B is a monolithic structure while the optical structure 110-A is formed of individually isolated islands included in the plurality of islands 116, which may have different advantages or limitations in terms of manufacturability depending on the geometric features (e.g., size) of the plurality of islands 116 of the optical structure 110-A and/or the plurality of openings 118 of the optical structure 110-B. For example, the plurality of islands 116 of the optical structure 110-A and/or the plurality of openings 118 of the optical structure 110-B may have different dimensions meaning ease of manufacture and/or accurate reproduction of the optical structure 110-A and/or optical structure 110-B may differ based on said dimensions with respect to the critical dimensions of the fabrication techniques utilized to form the corresponding optical structure.

Figure 1D:
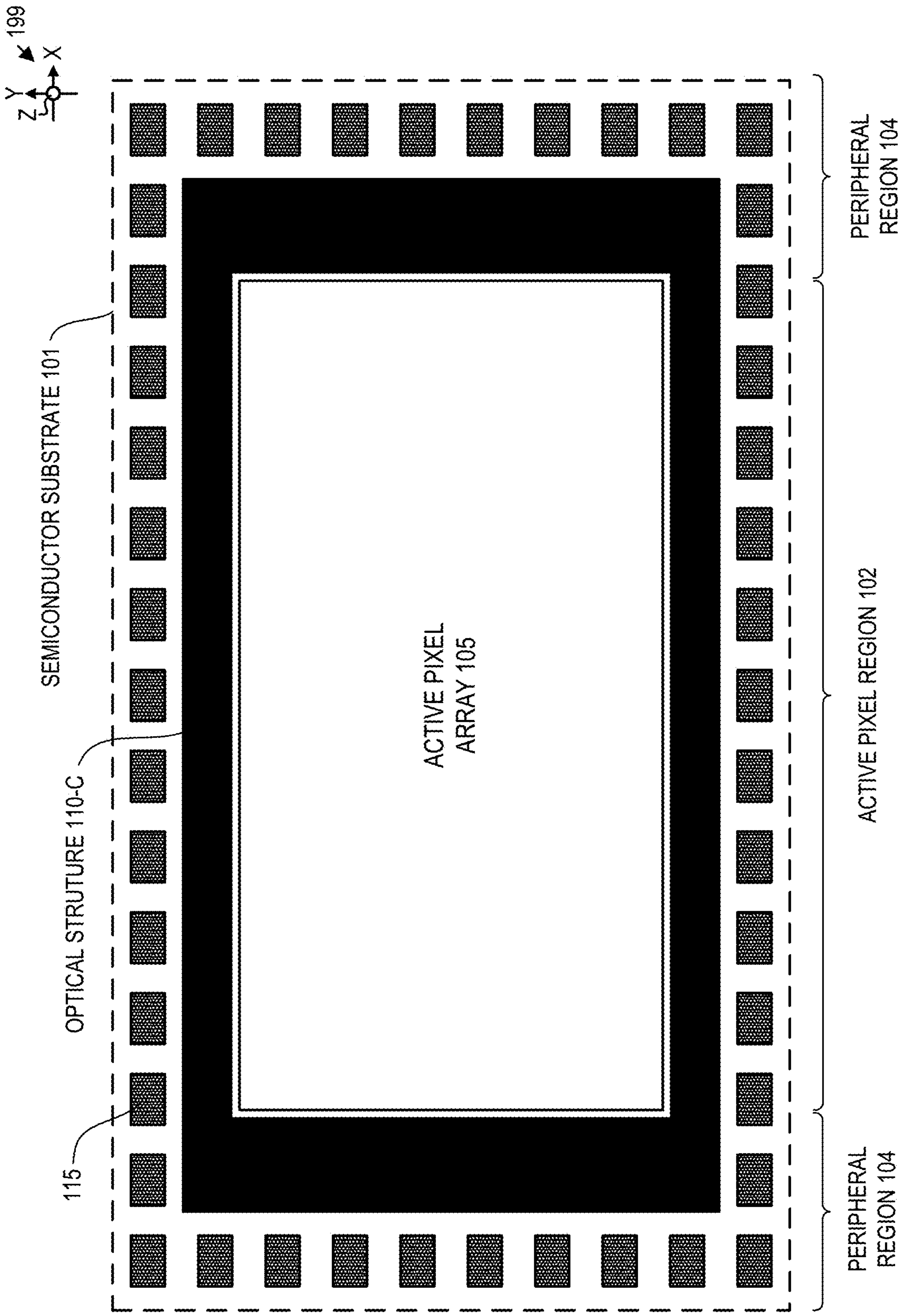
FIG. 1D illustrates optical structure, which is one possible implementation of the optical structure of the image sensor illustrated in FIG. 1A, in accordance with an embodiment of the disclosure.

FIG. 1D illustrates optical structure 110-C, which is one possible implementation of the optical structure 110 of the image sensor 100 illustrated in FIG. 1A, in accordance with an embodiment of the disclosure. Accordingly, the optical structure 110-C of FIG. 1D may include the same or similar features of the optical structure 110 of FIG. 1A (e.g., overall dimensions, relative location with respect to other components of the image sensor 100, composition, function, and the like). In the illustrated embodiment, the optical structure 110-C is a monolithic structure having a first dimension (e.g., inner width 173, outer width 174, inner length 175, or outer length 176 as labeled in FIG. 1A) greater than a second dimension (e.g., width 171 or length 172 as labeled in FIG. 1A) of the active pixel array 105. It is appreciated that in some embodiments, the first dimension and the second dimension extend along a common direction or are otherwise parallel to each other. As illustrated, the optical structure 110-C is a monolithic structure having a continuous and complete structure (e.g., without openings or voids) extending from an inner perimeter boundary to an outer perimeter boundary (e.g., from the inner boundary 111 to the outer boundary 112 illustrated in FIG. 1A). In some embodiments, the optical structure 110-C may be a sheet of one or more materials (e.g., a first layer of the first material, a second layer of the second material, and so on) having a flat upper surface and a center opening aligned with the active pixel array 105. In some embodiments, the optical structure 110-C may correspond to the optical structure 110-B illustrated in FIG. 1C when the plurality of openings 118 are omitted.

FIG. 2A illustrates a cross-sectional view 200-AA' along the line A-A' of the image sensor 100 illustrated of FIG. 1B, which includes the optical structure 110-A, in accordance with an embodiment of the disclosure. It is appreciated that FIGS. 1B-1D illustrate the image sensor 100 with different embodiments of the optical structure 110 (e.g., optical structures 110-A, 110-B, and 110-C). Thus, elements of image sensor 100 illustrated in FIG. 2A are not limited to only having an optical structure corresponding to the optical structure 110-A. Rather, the image sensor 100 may alternatively or additionally utilize other embodiments of the optical structure (e.g., optical structure 110-B of FIG. 1C, optical structure 110-C of FIG. 1D), in accordance with embodiments of the disclosure. It is further appreciated that the cross-sectional view 200-AA' illustrated in FIG. 2A may be mirrored to extend across an entirety of the image sensor 100 (e.g., the peripheral region 104 of the image sensor extends around the active pixel region 102 as illustrated in FIGS. 1A-1D).

Referring back to FIG. 2A, the image sensor 100 includes the semiconductor substrate 101 having a first side 212 (e.g., a backside or a front side) and a second side 211 (e.g., a front side or a backside), the plurality of contact pads 115 (e.g., metals such as Al, Au, Cu, other metals, metal alloys, polycrystalline silicon, other conductive materials, or combinations thereof), the optical structure 110-A including a plurality of islands 116 (e.g., one or more materials that may include titanium nitride, titanium, other metals, other metal nitrides, other metal oxides, or combinations thereof), a plurality of deep trench isolation (DTI) structures 206 (e.g., one or more dielectric or oxide materials such as silicon dioxide), a liner material 207 (e.g., a high-k dielectric such as hafnium oxide, aluminum oxide, tantalum oxide, or any other material having a dielectric constant greater than silicon dioxide) to provide surface passivation, a material stack 208 (e.g., one or more layers of a high-k dielectric layer such as tantalum oxide, hafnium oxide, aluminum oxide, or any other material having a dielectric constant greater than silicon dioxide) to provide surface passivation and/or anti-reflection benefits, a buffer layer 209 (e.g., one or more dielectric or oxide materials such as silicon dioxide), a metal shield 219 (e.g., tungsten or other metals), a low-refractive-index material 217 (e.g., silicon dioxide or any other material having a refractive index lower than the one or more materials included in the plurality of islands 116 and/or the metal shield 219), a plurality of photodiodes 220 (e.g., pinned photodiodes having doped regions with an opposite charge carrier type relative to the majority charge carrier type of the semiconductor substrate 101 such that an outer perimeter of the doped region forms a PN junction or a PIN junction of a photodiode) including a first photodiode 220-1, a second photodiode 220-2, a third photodiode 220-3, and a fourth photodiode 220-4, a metal grid 221 (e.g., aluminum, copper, tungsten, or other metals), a plurality of color filters 223 (one or more red, green, blue, infrared, clear, transparent, cyan, magenta, yellow, black, or any other color filter to filter visible or nonvisible light included in the incident light 198), a plurality of microlenses 224 (e.g., molded plastic or polymer material to form an optical structure to focus or otherwise direction incident light onto the plurality of photodiodes 220), a plurality of pixels 225 that form an active pixel array (e.g., the active pixel array 105 illustrated in FIGS. 1A-1D), a plurality of light attenuation structures 226 (e.g., one or more materials that may include titanium nitride, titanium, other metals, other metal nitrides, other metal oxides, or combinations thereof), a shallow trench isolation (STI) structure 242 (e.g., one or more dielectric or oxide materials such as silicon dioxide), a first metal layer 244 (e.g., gold, silver, aluminum, copper, tantalum, other metal materials, or combinations thereof) included in a metallization region of the image sensor 100, and an interlayer dielectric 245 (e.g., silicon dioxide or other insulating material) included in the metallization region of the image sensor 100.

Disposed in the active pixel region 102 of the image sensor 100 is the plurality of pixels 225 that collectively forms an active pixel array (e.g., the active pixel array 105 illustrated in FIGS. 1A-1D) that has a split-pixel architecture. However, it is appreciated that in other embodiments, the image sensor 100 may not have a split-pixel architecture. In the illustrated embodiment, the plurality of pixels 225 includes at least two types of pixels, including first pixels 225-H and second pixels 225-L. It is appreciated that the first pixels 225-H and the second pixels 225-L are not necessarily different in geometric size or area, but rather have a difference in sensitivity to incident light 198. In one embodiment, the second pixels 225-L are more sensitive to the incident light 198 than the first pixels 225-H due to the plurality of attenuation structures 226 being optically disposed proximate to the first side 212 of the semiconductor substrate 101 between first photodiodes (e.g., 220-2, 220-4) included in the plurality of photodiodes 220 and corresponding optically aligned color filters (e.g., 223-2 and 223-4). The split-pixel architecture of the image sensor 100 facilitates high dynamic range image acquisition of an external scene as the first pixels 225-H may not be as easily saturated by the incident light 198 as the second pixels 225-L. Specifically, the plurality of light attenuation structures 226 attenuate an intensity of light propagating through the first pixels 225-H via absorption, reflection, or the like. It is appreciated that in some embodiments, individual attenuation structures included in the plurality of light attenuation structures 226 each correspond to a multi-layer stacked structure including a first layer of a first material and a second layer of a second material (see, e.g., FIG. 2E).

As illustrated in FIG. 2A, individual pixels included in the plurality of pixels 225 each includes one of the plurality of photodiodes 220. Individual microlenses are optically aligned with an underlying photodiode included in the plurality of photodiodes and are shaped to focus or otherwise direct (e.g., in conjunction with one or more lens included in a lens module of the image sensor), the incident light 198 through an underlying color filter included in the plurality of color filters to the underlying photodiode to generate image charge representative of an external scene to the image sensor 100. The plurality of color filters 223 may include green (“G”), red (“R”), blue (“B”) color filters to form a full color image pixel. In other embodiments, additional or different color filters may be included in the plurality of color filters 223 (e.g., one or more red, green, blue, infrared, clear, transparent, cyan, magenta, yellow, black, or any other color filter to filter visible or nonvisible light included in the incident light 198). In some embodiments, each of the plurality of photodiodes 220 is laterally surrounded by one of the plurality of DTI structures 206, which may correspond to an insulating material (e.g., silicon dioxide) filled in a trench lined with the liner material 207 (e.g., a high-k dielectric such as hafnium (IV) oxide, aluminum (III) oxide, tantalum (V) oxide, or any other material or combination of materials having a dielectric constant greater than silicon dioxide). In some embodiments, the liner material 207 may be also disposed between the buffer layer 209 and the semiconductor substrate 101 to provide surface passivation or otherwise be included in the material stack 208. The active pixel region 102 further includes the metal grid 221, which correspond to one or more metal materials disposed between adjacent color filters (e.g., laterally surrounding individual color filters included in the plurality of color filters 223) to mitigate optical or electrical crosstalk between adjacent pixels included in the plurality of pixels 225. In some embodiments, a layer of dielectric having a refractive index lower than each of the plurality of color filters 223 is disposed on the metal grid 221 to form a low refractive index grid. In such an embodiment, the layer of dielectric and the metal grid 221 collectively optically isolate and separate adjacent color filters included in the plurality of color filters 223. In some embodiments, the metal grid 221 is surrounded and embedded in the layer of dielectric. In the illustrated example, the metal grid 221 is embedded within the low-refractive-index material 217 as illustrated in FIG. 2A. In some embodiments, the first metal included in the metal grid 221 may correspond to tungsten.

In the illustrated embodiment, the plurality of contact pads 115, the optical structure 110-A including the plurality of islands 116, the material stack 208, the low-refractive-index material 217, the buffer layer 209, the metal shield 219, the shallow trench isolation (STI) structure 242, the first metal layer 244 included in a metallization region of the image sensor 100, and the interlayer dielectric 245 included in the metallization region of the image sensor 100 are disposed, at least in part, within the peripheral region 104. In some embodiments, the metal shield 219 is disposed in or on the semiconductor substrate 101 and within the peripheral region 104 proximate to the first side 212 of the semiconductor substrate 101. The metal shield is further disposed between the first side 212 of the semiconductor substrate 101 and the optical structure 110-A. In the same or other embodiments, individual islands included in the plurality of islands 116 of the optical structure 210-A each correspond to a multi-layer stacked structure including a first layer of a first material and a second layer of a second material (see, e.g., FIG. 2B). Additionally, in some embodiments, individual islands included in the plurality of islands 116 of the optical structure 110-A are each completely encapsulated by the low-refractive-index material 217.

In some embodiments, the peripheral region 104 further includes least one of an optical black reference array 260, a dummy array 262, or peripheral circuitry 264 included in the image sensor 100, which may be formed in or on the semiconductor substrate 101 between the plurality of contact pads 115 and the active pixel array (e.g., the plurality of pixels 225). In most embodiments, the metal shield 219 is disposed between the optical structure 110-A and at least one of the optical black reference array 260, the dummy array 262, or peripheral circuitry 264 included in the image sensor 100. In some embodiments, the metal shield 219 may mitigate or otherwise prevent incident light from reaching the optical black reference array 260 to ensure accurate black level detection. In the illustrated embodiment, the dummy array 262 is disposed between the optical black reference array 260 and the peripheral circuitry 264. However, other configurations may be utilized in other embodiments (e.g., the optical black reference array disposed between the dummy array 262 and the peripheral circuitry 264). In some embodiments, the optical black reference array 260 and the dummy array 262 may each include a plurality of photodiodes (e.g., similar or otherwise identical to the plurality of photodiodes 220) arranged in an array. The photodiodes included in the optical black reference array 260 may be isolated or otherwise shielded from light (e.g., by the metal shield 219) to configure image charge generated by the photodiodes included in the optical black reference array 260 to correspond to a black reference level or dark current for the image sensor 100 (e.g., for dark current calibration or compensation when processing signals from or otherwise associated with the plurality of pixels 225 included in the active pixel array 105). In most embodiments, the photodiodes in the dummy array 262 may not be utilized for signal generation. Rather, the photodiodes in the dummy array 262 may be utilized to provide spacing, a buffer region, or otherwise mitigate noise or crosstalk between the peripheral circuitry 264 and the black reference array 260. In some embodiments, the peripheral circuitry 264 may include an array of decoupling capacitors to reduce circuitry noise between the semiconductor substrate 101 and an underlying logic wafer (see, e.g., FIG. 4). In some embodiments, support circuitry that may be included in the peripheral circuitry 264 may include, but is not limited to, row and column decoders and drivers, analog signal processing chains, digital imaging processing blocks, memory, timing and control circuits, input/output interfaces, a vertical scanner, sample and hold circuitry, amplifiers, analog-to-digital converter circuitry, and any other embodiments of logic and/or circuitry that is appropriate for the function of the image sensor 100.

The peripheral region 104 further includes the plurality of contact pads 115 (e.g., metals such as Al, Au, Cu, other metals, metal alloys, polycrystalline silicon, other conductive materials, or combinations thereof) to facilitate an electrical connection to one or more metal layers (e.g., first metal layer 244) included in a metallization region of the image sensor 100 (e.g., a back end of the line portion of the image sensor 100 that facilitates connections between components of the image sensor 100). It is appreciated that STI structure 242 (e.g., an oxide material such as silicon dioxide or other insulating material) is disposed proximate to the second side 211 of the semiconductor substrate 101 and further electrically isolates each individual contact pad included in the plurality of contact pads 115.

In the illustrated embodiment, the active pixel region 102 and the peripheral region 104 both include the material stack 208 (e.g., one or more layers of materials, which may include one or more high-k dielectric layers formed of tantalum oxide, hafnium oxide, aluminum oxide, or other oxide materials having a dielectric constant greater than silicon dioxide) to passivate surface hydroxyl groups on the first side 212 of the semiconductor substrate 101 and/or mitigate reflection at the interface defined by the first side 212 of the semiconductor substrate 101. Additionally, the active pixel region 102 and the peripheral region 104 both include buffer layer 209 (e.g., an oxide material such as silicon dioxide) to mitigate stress induced from processing (e.g., during chemical mechanical polishing). As illustrated, both the material stack 208 and the buffer layer 209 may extend continuously across the active pixel region 102 and the peripheral region 104. In some embodiments, the material stack 208 and the buffer layer 209 are disposed between the plurality of photodiodes 220 and the plurality of light attenuation structures 226. In the same or other embodiments, the metal shield 219 is disposed between the optical structure 110-A and both the material stack 208 and the buffer layer 209. In some embodiments, the material stack 208 and the buffer layer 209 are both disposed between the optical structure 110-A and at least one of the optical black reference array 260, the dummy array 262, or peripheral circuitry 264 included in the image sensor 100.

As illustrated in FIG. 2A, the transparent cover 240 (e.g., glass or other transparent material) also extends across both the active pixel region 102 and the peripheral region 104 to cover or otherwise protect a light-receiving surface of the image sensor 100 while still allowing the incident light 198 to reach the light-receiving surface. As illustrated, the plurality of light attenuation structures 226 are disposed between the transparent cover 240 and the plurality of photodiodes 220. Additionally, the optical structure 110-A is disposed between the transparent cover 240 and the metal shield 219. Similarly, the optical structure 110-A is disposed between the transparent cover 240 and at least one of the optical black reference array 260, the dummy array 262, or peripheral circuitry 264 included in the image sensor 100.

In the illustrated embodiment of FIG. 2A, incident light 198 includes stray light 198-A and 198-B, which is incident on the peripheral region 104 of the image sensor. However, since the angle of incident is oblique (e.g., an angle of incident of 30° with respect to a normal to a surface of one or more components of the image sensor such as a surface of the metal shield 219), the stray light 198-A, as illustrated, could reflect off of the metal shield 219 and then off of an inner surface of the transparent cover 240 to eventually be incident upon the active pixel region 102 if the optical structure 110-A (or other embodiments of the optical structure 110 such as optical structures 110-B and/or 110-C). However, the optical structure 110-A, in combination with the low-refractive-index material 217 and the metal shield 219 forms a light-trapping structure that redirects or otherwise traps light (e.g., by scattering, refraction, reflection, and/or absorption) to reduce reflection from between the metal shield 219 and the transparent cover 240 as illustrated by stray light 198-B. For example, the stray light 198-B may be repeatedly reflected between one or more of the plurality of islands 116 and the metal shield 219, which may result in attenuation of the stray light 198-B or otherwise inhibit the stray light 198-B from reaching the active pixel region 102. In other words, the various embodiments of the optical structure 110 (e.g., optical structures 110-A, 110-B, and/or 110-C) configure the image sensor 100 to mitigate instances of stray light 198-A from occurring and, more generally, mitigate stray light from reaching the active pixel region 102.

It is further appreciated that certain elements of the image sensor 100 may have a relative relationship. For example, in the illustrated embodiment, at least part of the individual attenuation structures included in the plurality of light attenuation structures 226 and the individual islands included in the plurality of islands 116 of the optical structure 110-A are aligned along a common plane 280 (e.g., a plane aligned parallel to the x-y plane of the coordinate system 199. This is because in some embodiments, the plurality of light attenuation structures 226 and the plurality of islands 116 of the optical structure 110-A (or more generally the optical structure 110-A) may share a common composition (e.g., the plurality of islands 116 or more generally the optical structure 110-A and the plurality of light attenuation structures 226 may be fabricated simultaneously to reduce cost or otherwise simplify manufacturing of the image sensor 100). Similarly, in some embodiments, the metal shield 219 and the metal grid 221 may be aligned along a common plane (e.g., parallel to the common plane 280) and further share a common composition (e.g., the metal shield 219 and the metal grid 221 may be fabricated simultaneously to reduce cost or otherwise simplify manufacturing of the image sensor 100).

FIG. 2B illustrates a more detailed view of the optical structure 110-A illustrated in FIG. 2A, in accordance with an embodiment of the disclosure. The illustrated view includes the plurality of islands 116 (e.g., first island 116-1 and second island 116-2) of the optical structure 110-A with individual islands included in the plurality of islands 116 completely encapsulated in the low-refractive-index material 217 and further disposed above of the metal shield 219. More specifically, the low-refractive-index material 217 is disposed between the plurality of islands 116 (or more generally, the optical structure 110-A) and the metal shield 219. Additionally, adjacent islands included in the plurality of islands 116 (e.g., first island 116-1 is adjacent to second island 116-2 with no intervening island included in the plurality of islands 116 disposed between the first island 116-1 and the second island 116-2) are separated from one another by the low-refractive-index material 217.

In the illustrated embodiment, the plurality of islands 116 (or more generally the optical structure 210-A) includes one or more materials (e.g., a first material 231 and a second material 232), which may be homogeneous layers of a given material or materials. In other words, the optical structure 110-A is a multi-layer stacked structure including a first layer of the first material 231 and a second layer of the second material 232. In most embodiments, layers included in the multi-layer stacked structure have substantially the same lateral dimensions (e.g., width and length of the first layer and the second layer are substantially the same). It is appreciated that the term "substantially" corresponds to a 10% or less difference between compared features accounting for processing variation. In the same or other embodiments, the depth of thickness layers included in the multi-layer stacked structure may be the same or different (e.g., the first layer and the second layer may have the same or different thicknesses). In some embodiments, the optical structure 110-A is not limited to two layers and/or two different materials. In other words, additional materials and/or additional layers may be included in the optical structure 110-A to facilitate mitigation of stray light. For example, in some embodiments, there may be more than one individual layer of each of the first material 231 and the second material 232 (e.g., layers of the first material 231 and the second material 232 may alternately repeat to include more than two layers in the multi-layer stackedstructure of the optical structure 110-A) to mitigate the stray light with specific angle(s) of incidence. In the same or other embodiments, the layers of the optical structure 110-A are not limited to the first material 231 and the second material 232. Rather, additional materials or layers of materials may further be included in the optical structure 110-A.

In some embodiments, the optical structure 110 is configured to mitigate stray light by functioning as a light-trapping structure that redirects or otherwise traps light (e.g., by scattering, refraction, reflection, and/or absorption) to reduce reflection from the metal shield 219. In some embodiments, this is achieved, at least in part, by having a composition of the one or more materials included in the optical structure 110 to have a specific relative relationship, in terms of refractive index, with nearby elements (e.g., the low-refractive-index material 217 and the metal shield 219).

In some embodiments, the first material 231 is titanium nitride and the second material 232 is titanium. However, in other embodiments, the first material 231 and the second material 232 may be different materials so long as they meet certain design criteria of the optical structure 110-A to configure the optical structure 110-A to mitigate stray light. Specifically, in some embodiments, the first material 231 has a first refractive index, the second material 232 has a second refractive index, a first metal included in the metal shield has a metal refractive index, and the low-refractive-index material has a corresponding refractive index. In such an embodiment, the first refractive index of the first material 231 and the second refractive index of the second material 232 are each less than the metal refractive index of the first metal included in the metal shield 219 but greater than the corresponding refractive index of the low-refractive-index material. In other words, individual islands included in the plurality of islands 116 of the optical structure 110-A each include the first material having the first refractive index that is less than the metal refractive index of the first metal included in the metal shield 219 but greater than the corresponding refractive index of the low-refractive-index material 217. It is appreciated that in some embodiments the composition configuration (i.e., multi-layer stacked structure) of the optical structure 110-A in combination with geometric dimensions and/or relative spacing of the plurality of islands 116 results in the optical structure 110-A redirecting stray light away from the active pixel region of the image sensor (e.g., stray light becomes trapped between the plurality of islands 116 and the metal shield 219 such that the stray light is reflected, refracted, scattered, absorbed, attenuated, or combinations thereof).

In some embodiments, adjacent islands included in the plurality of islands 116 are separated from one another by the low-refractive-index material (see, e.g., first island 116-1 adjacent to second island 116-2 separated from one another by low-refractive-index material 217). The separation distance between the adjacent islands included in the plurality of islands 116 may be uniform or different. In some embodiments, the separation distance between the adjacent islands is uniform and further optimized to mitigate stray light having a pre-determined angle of incidence (e.g., 30°) with respect to a normal to the surface of the image sensor 100. More specifically, the adjacent islands included in the plurality of islands 116 are separated from one another by a first separation distance 252 between first island 116-1 and second island 116-2. In the same or other embodiments, the adjacent islands are separated from the metal shield 219 by a second separation distance 266. In the same or other embodiments, the first separation distance 252 between the adjacent islands is greater than a combination of a thickness 263 of the adjacent islands and the second separation distance (e.g., separation distance between the plurality of islands 116, and the metal shield 219, which corresponds to second separation distance 266). In other words, the first separation distance 252 is greater than the sum of the thickness 263 and the second separation distance 266. In some embodiments, the plurality of islands 116 of the optical structure 110-A may be optimized to mitigate stray light with a pre-determined angle of incidence based on the following equation:

$$d \geq \frac{2t}{\tan\emptyset},$$

where, d corresponds to the separation distance 252 between adjacent islands included in the plurality of islands 116, t corresponds to a total thickness represented by the thickness 263 of the plurality of islands 116 added to the second separation distance 266, and θ corresponds to the pre-determined angle of incidence of light with respect to a normal to the surface (e.g., x-y plane of the coordinate system 199) of the image sensor (e.g., an illuminated surface plane of the first side 212).

Figure 2C:
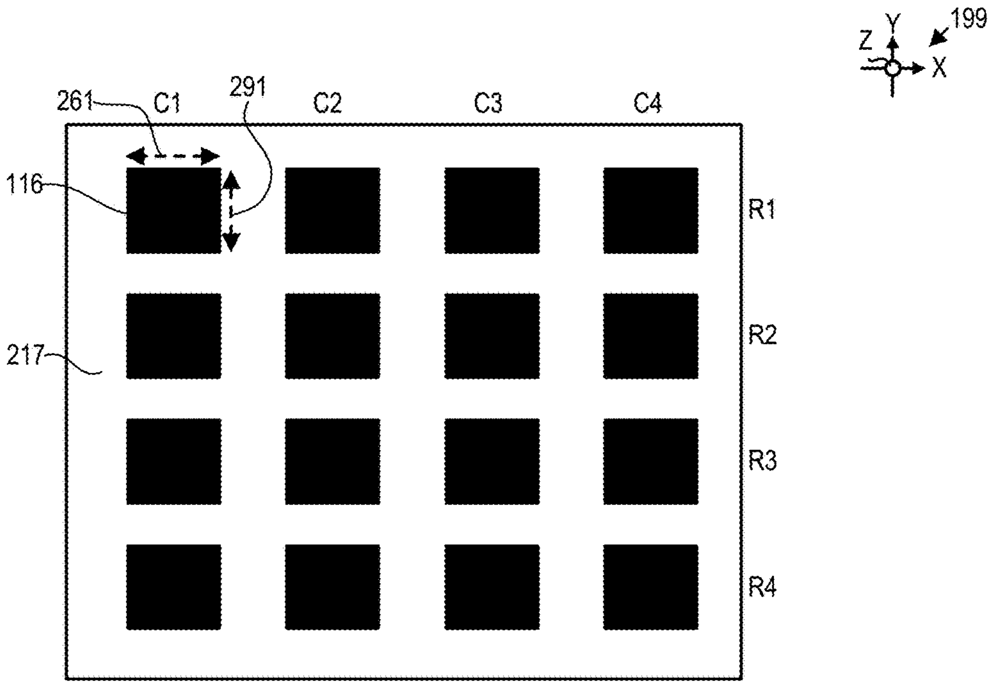
FIG. 2C illustrates a top view of an example arrangement of the plurality of islands included in the optical structure illustrated in FIG. 2A, in accordance with an embodiment of the disclosure.

In some embodiments, the plurality of islands 116 may be defined as having an area with a length 261 (e.g., along the x-axis of the coordinate system 199) and a width (e.g., along the y-axis of the coordinate system 199 as illustrated in FIG. 1B or otherwise corresponding to width 291 illustrated in FIG. 2C). In some embodiments, the length 261 and/or width of individual islands included in the plurality of islands 116 may be from 0.10 μm to 1.00 μm. In some embodiments, a first thickness 267 of the first material 231 and/or a second thickness 268 of the second material (e.g., along the z-axis of the coordinate system 199) is from 1 nm to 100 nm. In one embodiment, the first thickness 267 of the first material (e.g., titanium nitride) is greater than the second thickness 268 of the second material (e.g., titanium). In the same or other embodiments, the first thickness 267 of the first material is from 5 nm to 70 nm while the second thickness 268 is from 2 nm to 60 nm. It is appreciated that in some embodiments, the first thickness 267 and the second thickness 268 may be the same or different.

FIG. 2C illustrates a top view of an example arrangement of the plurality of islands 116 included in the optical structure 110-A illustrated in FIG. 2A, in accordance with an embodiment of the disclosure. It is appreciated that the example arrangement of the plurality of islands illustrated in FIG. 2C may also be implemented in the optical structure 110-B illustrated in FIG. 1C (e.g., the plurality of openings 118 that form a plurality of islands illustrated in FIG. 1C may have the same or a similar arrangement as the plurality of islands 116). Referring back to FIG. 2C, individual islands included in the plurality of islands 116 of the optical structure each defined as having a length 261 (e.g., length along the x-axis of the coordinate system 199) and a width 291 (e.g., length along the y-axis of the coordinate system 199) each have a common shape (e.g., rectangle or square as illustrated or other shapes such as circle, ellipse, triangle, pentagon, hexagon, octagon, any other regular or irregular polygon, or other closed shapes), and are uniformly separated from adjacent islands. However, in other embodiments, the plurality of islands 116 may have geometric dimensions and/or different shapes (e.g., rectangle or square as illustrated or other shapes such as circle, ellipse, triangle, pentagon, hexagon, octagon, any other regular or irregular polygon, other closed shapes, or combinations thereof). Additionally, in the illustrated embodiment, individual islands included in the plurality of islands 116 are arranged in rows (e.g., R1, R2, R3, R4, and so on) and columns (e.g., C1, C2, C3, C4, and so on) such that perimeter boundaries of the plurality of islands 116 in a common row and/or common column are aligned.

Figure 2D:
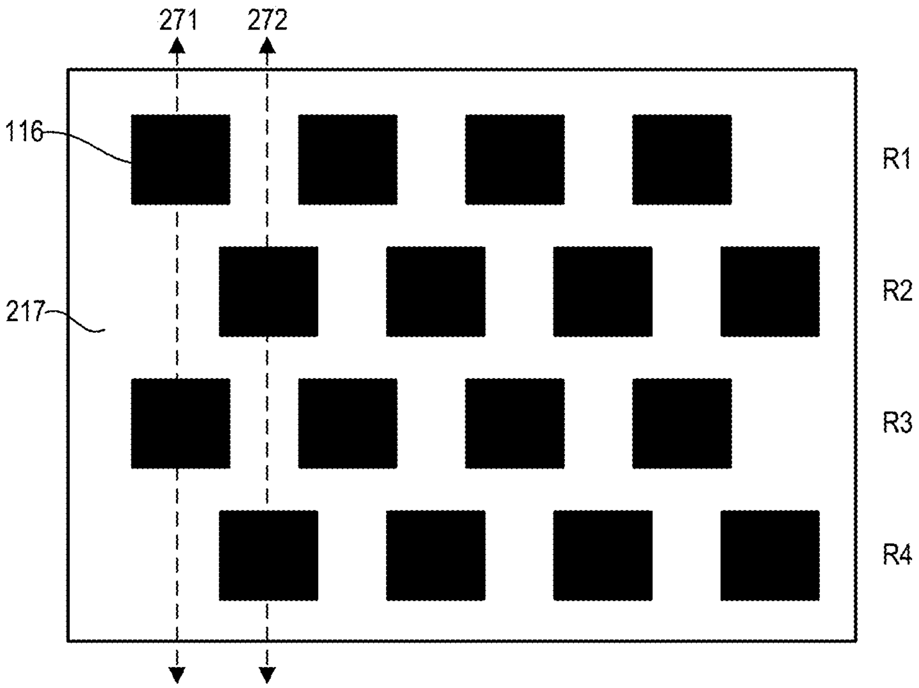
FIG. 2D illustrates a top view of another example arrangement of the plurality of islands included in the optical structure illustrated in FIG. 2A to form an offset island pattern, in accordance with an embodiment of the disclosure.

FIG. 2D illustrates a top view of another example arrangement of the plurality of islands 116 included in the optical structure 110-A illustrated in FIG. 2A to form an offset island pattern (e.g., the low-refractive-index material 217 forms an offset grid, which is defined by the position of the plurality of islands 116), in accordance with an embodiment of the disclosure. It is appreciated that the example arrangement of the plurality of islands illustrated in FIG. 2D may also be implemented in the optical structure 110-B illustrated in FIG. 1C (e.g., the plurality of openings 118 that form a plurality of islands illustrated in FIG. 1C may have the same or a similar arrangement as the plurality of islands 116). Referring back to FIG. 2C, adjacent rows included in the rows (e.g., R1, R2, R3, R4) or adjacent columns included in the columns (not labeled) are not aligned to configure the plurality of islands 116 to form the offset island pattern. For example, a first set of islands included in the plurality of islands 116 and positioned within R1 are not aligned with a second set of islands included in the plurality of islands 116 that are positioned within R2. Put in another way, the offset island pattern may be defined as having islands positioned in alternating rows that are aligned, but offset from islands included in adjacent rows (e.g., individual islands included in the plurality of islands 116 in R1 and R3 along direction 271 are aligned with respect to each other but not aligned with adjacent islands included in the plurality of islands 116 in R2 and R4 along direction 272).

Figure 2E:
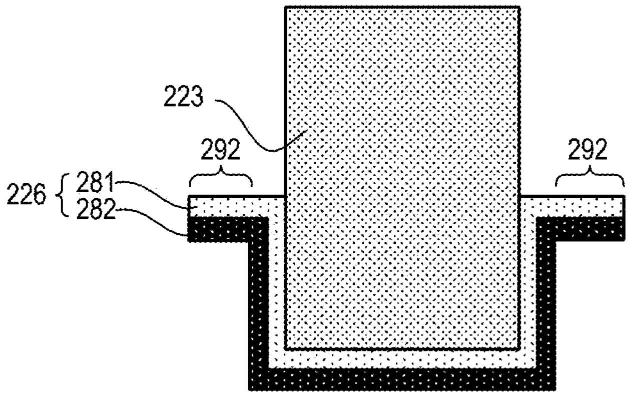
FIG. 2E illustrates a more detailed view of an attenuation structure included in the plurality of light attenuation structures of FIG. 2A, in accordance with an embodiment of the disclosure.

FIG. 2E illustrates a more detailed view of an attenuation structure included in the plurality of light attenuation structures 226 of FIG. 2A, in accordance with an embodiment of the disclosure. In some embodiments, each individual attenuation structure included in the plurality of light attenuation structures 226 may be disposed between a corresponding color filter and a respective photodiode of a given one of the first pixels 225-H included in the active pixel array (e.g., as illustrated in FIG. 2A). As illustrated, individual attenuation structures included in the plurality of light attenuation structures 226 may include one or more materials (e.g., a third material 281 and a fourth material 282, which may respectively be the same as the first material 231 and the second material 232 of the plurality of islands 116 illustrated in FIG. 2B). The one or more materials of the plurality of light attenuation structures 226 may be homogeneous layers of a given material or materials. In other words, the individual attenuation structures included in the plurality of light attenuation structures 226 may be a multi-layer stacked structure including corresponding layers of the third material 281 and the fourth material 282. In some embodiments, the plurality of light attenuation structures 226 is not limited to two layers and/or two different materials. In other words, additional materials and/or additional layers may be included in the plurality of light attenuation structures 226 to attenuation of incident light. For example, in some embodiments, there may be more than one individual layer of each of the third material 281 and the fourth material 282 (e.g., layers of the third material 281 and the fourth material 282 may alternately repeat to include more than two layers in the multi-layer stacked structure of the plurality of light attenuation structures 226). In the same or other embodiments, the layers of the plurality of light attenuation structures 226 are not limited to the third material 281 and the fourth material 282. Rather, additional materials or layers of materials may further be included in the plurality of light attenuation structures 226. In some embodiments, the third material 281 is titanium nitride and the fourth material 282 is titanium. However, in other embodiments, the third material and the fourth material may be different materials. In some embodiments, the plurality of light attenuation structures 226 and the optical structure (e.g., optical structure 110 illustrated in FIG. 1A, optical structure 110-A illustrated in FIGS. 1B, 2A, and 2B, optical structure 110-B illustrated in FIG. 1C, and optical structure 110-C illustrated in FIG. 1D) may be formed simultaneously (e.g., to reduce processing costs and or fabrication complexity of the image sensor) and have identical compositions.

In some embodiments, end portions 292 of the plurality of light attenuation structures 226 may be coplanar with the optical structure 110 (e.g., one or more elements of the optical structures 110-A, 110-B, or 110-C may be coplanar with the end portions 292 of the plurality of light attenuation structures 226). It is appreciated that the end portions 292 correspond to terminal or distal ends of the plurality of light attenuation structures 226 that are substantially planar. It is further appreciated that in some embodiments, individual layers of the one or more materials of the plurality of light attenuation structures 226 and the optical structure 110 may be coplanar. For example, when referring to FIGS. 2B and 2D, the layer of the third material 281 included in the end portions 292 of the plurality of light attenuation structures 226 may be coplanar with the layer of the first material 231 included in the plurality of islands 116 of the optical structure 110-A while the layer of the fourth material 282 included in the end portions 292 of the plurality of light attenuation structures 226 may be coplanar with the layer of the second material 232 included in the plurality of islands 116 of the optical structure 110-A. In the same or different embodiments, the first thickness of the first material 231 may be substantially the same as a third thickness of the layer of the third material 281 included in the end portions 292 of the plurality of light attenuation structures 226. The second thickness of the second material 232 may be substantially the same as a fourth thickness of the layer of the fourth material 282 included in the end portions 292 of the plurality of light attenuation structures 226.

Figure 2F:
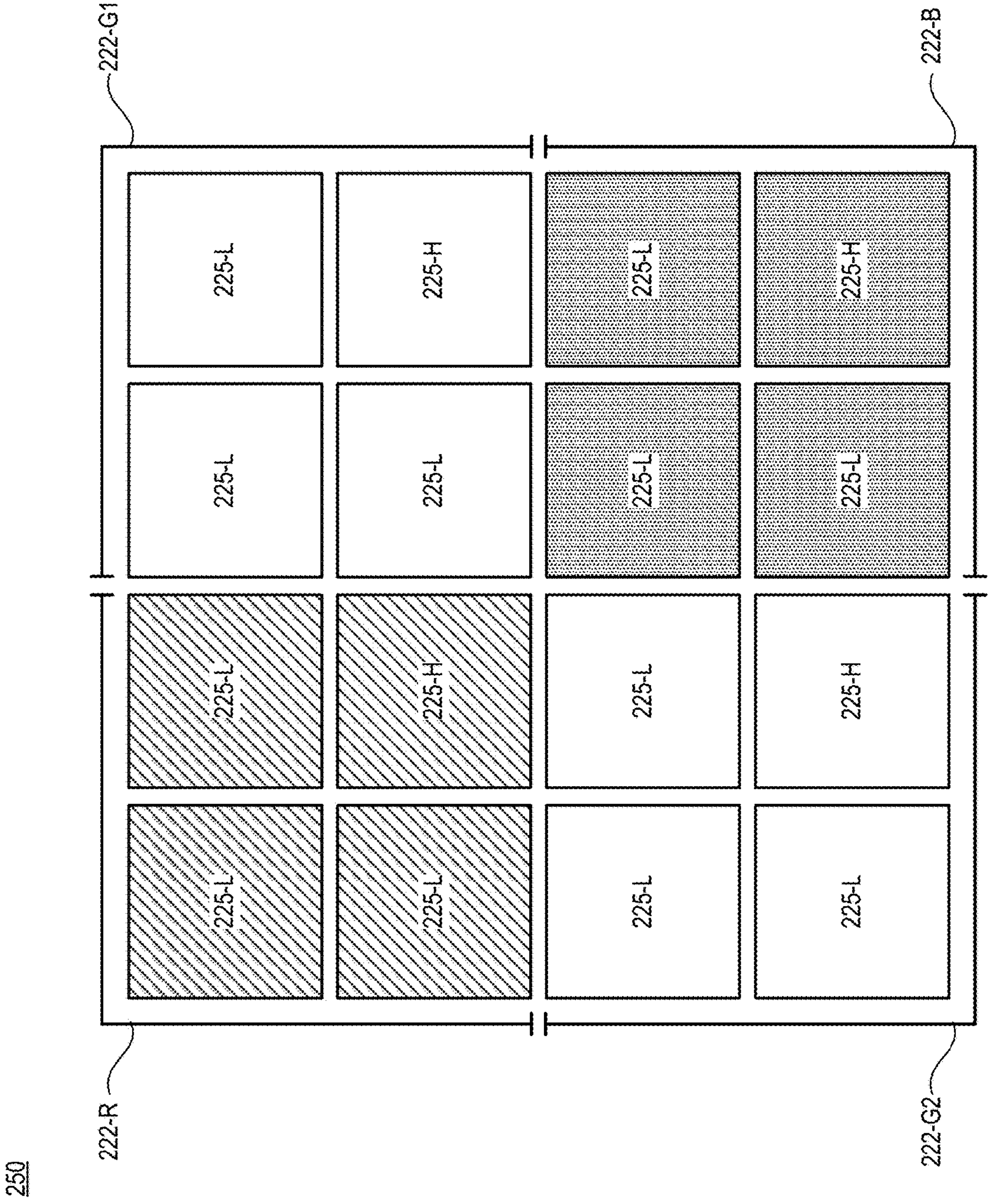
FIG. 2F illustrates a top view of an example two-by-two pixel cell array, which may be included in the active pixel array of the image sensor of FIG. 1A, in accordance with an embodiment of the disclosure.

FIG. 2F illustrates a top view of an example two-by-two pixel cell array 250, which may be included in the active pixel array of the image sensor 100 of FIG. 1A, in accordance with an embodiment of the disclosure. In the illustrated embodiment, the two-by-two pixel cell array 250 corresponds to a minimal repeat unit of an image sensor (e.g., image sensor 100 illustrated in FIGS. 1A-1D), which includes four pixel cells (e.g., 222-R, 222-G1, 222-G2, 222-B) arranged in a two-by-two pattern. In the illustrated embodiment, the minimal repeat unit includes two green pixel cells (e.g., 222-G1 and 222-G2), one red pixel cell (e.g., 222-R), and one blue pixel cell (e.g., 222-B) to form a full color image pixel cell. It is appreciated that the "color" of a given pixel cell is indicative of the corresponding color of the color filters included in each pixel associated with the given pixel cell (e.g., the plurality of color filters 223 illustrated in FIG. 2A). However, as discussed previously, different arrangements (e.g., other than a minimal repeat unit including two green, one blue, and one red pixel cell) may be utilized and may include, but is not limited to, one or more red, green, blue, infrared, clear, transparent, cyan, magenta, yellow, black, or any other pixel cell having a corresponding color filter to filter visible or nonvisible light.

It is further appreciated that multiple instances of the minimal repeat unit illustrated in FIG. 2F may collectively form an active pixel array (e.g., the active pixel array 105 illustrated in FIGS. 1A-1D). Referring back to FIG. 2F, each pixel cell includes a two-by-two arrangement of four pixels included in the plurality of pixels 225 (e.g., three "low light" pixels denoted by the suffix "L" and one "high contrast" pixel denoted by the suffix "H") arranged in a two-by-two array, each with a corresponding structure as indicated in FIG. 2A, in accordance with embodiments of the disclosure.

Figure 3:
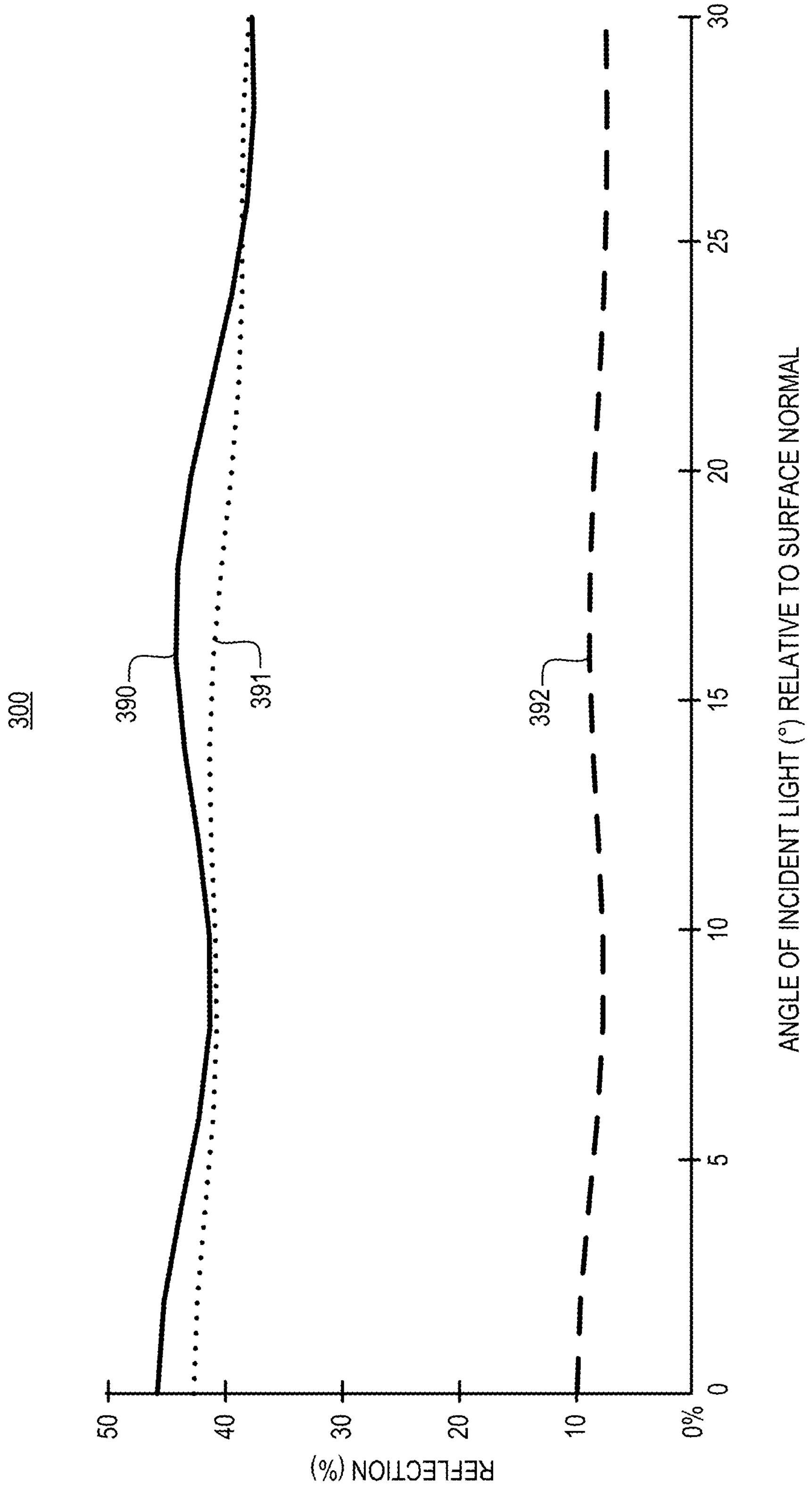
FIG. 3 illustrates an example chart showing reflection with respect to angle of light incident upon an image sensor when the image sensor includes an optical structure, in accordance with an embodiment of the disclosure.

FIG. 3 illustrates an example chart 300 showing reflection with respect to angle of light incident upon an image sensor when the image sensor includes an optical structure, in accordance with an embodiment of the disclosure. More specifically, the chart shows an optical simulation for reflection with respect to incident light for an embodiment without an optical structure (e.g., an image sensor without the optical structure 110 illustrated in FIG. 1A) corresponding to line 390, an embodiment of an image sensor with the optical structure 110-C illustrated in FIG. 1D corresponding to line 391, and an embodiment of an image sensor with the optical structure 110-A illustrated in FIG. 1B corresponding to line 392. As can be seen the optical structure 110-C provides a marginal improvement to reducing the reflection of stray light when comparing line 391 to line 390. Moreover, the optical structure 110-A provides a significant improvement at mitigating stray light when comparing line 392 to both lines 391 and 390.

Figure 4:
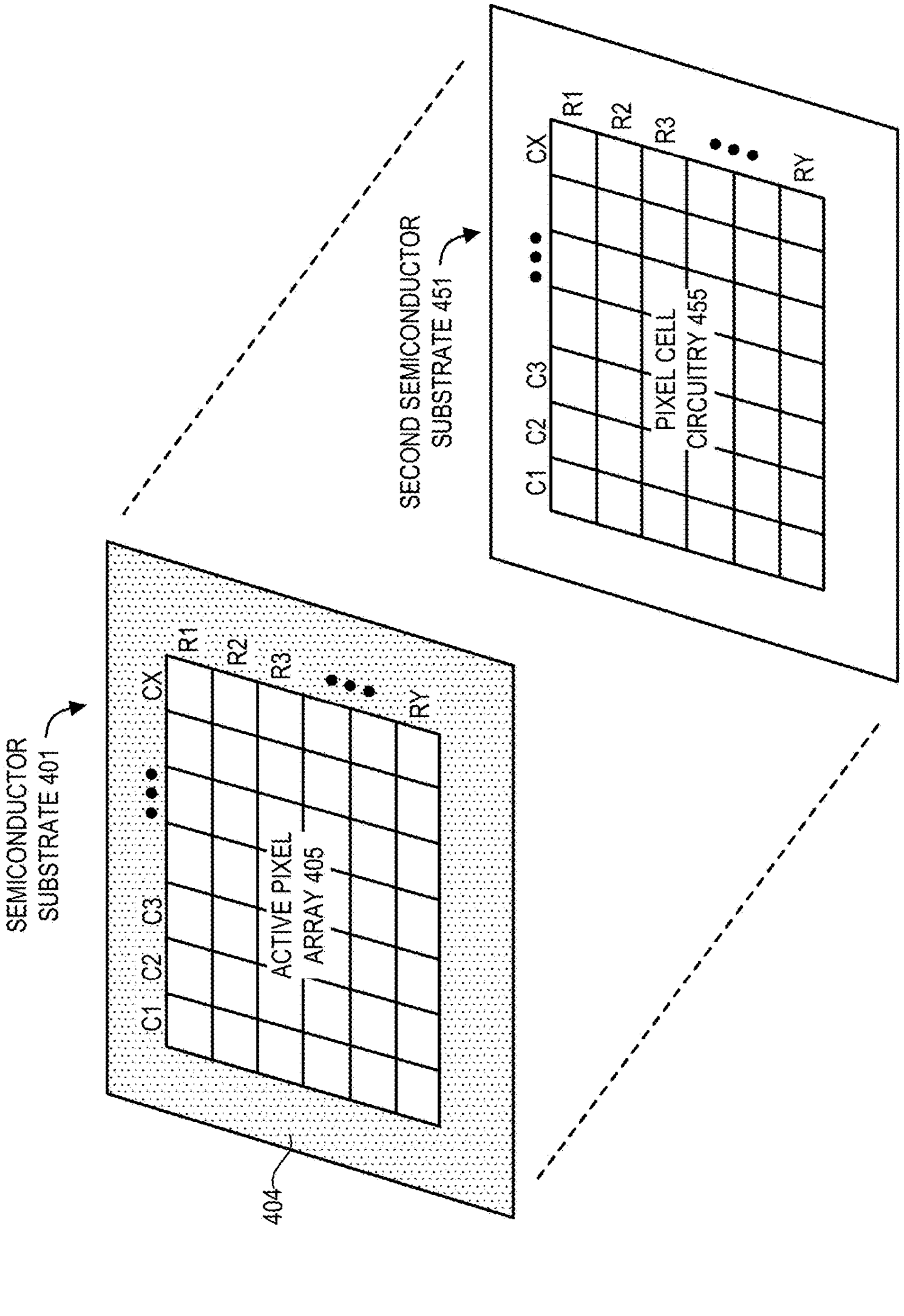
FIG. 4 illustrates an example stacked image sensor 400, which may implement the image sensor 100 illustrated in FIGS. 1A-1D, in accordance with embodiments of the disclosure.

FIG. 4 illustrates an example stacked image sensor 400, which may implement the image sensor 100 illustrated in FIGS. 1A-1D, in accordance with embodiments of the disclosure. The stacked image sensor 400 includes semiconductor substrate 401 (which may correspond to the image sensor 100 illustrated in FIGS. 1A-1D) and second semiconductor substrate 451, each of which may correspond to a part of or an entirety of a semiconductor wafer in accordance with embodiments of the disclosure. The semiconductor substrate 401 includes an active pixel array 405, which may correspond to the active pixel array 105 illustrated in FIGS. 1A-1D and include an optical structure to mitigate stray light. The second semiconductor substrate 451 includes pixel cell circuitry 455 (e.g., for readout of the image charge from the active pixel array 405).

In the illustrated embodiment of FIG. 4, the stacked image sensor 400 is a stacked complementary metal-oxide semiconductor (CMOS) device formed, at least in part, by the semiconductor substrate 401 (e.g., a first die) and the second semiconductor substrate 451 (e.g., a second die) that are stacked and coupled together (e.g., electrically and/or physically) in a stacked chip scheme achieved via bonding (e.g., oxide bonding, metal bonding, hybrid bonding), silicon connections (e.g., through silicon vias), other suitable circuit coupling technologies, or combinations thereof. Additionally, it is appreciated that the view presented in FIG. 4 may omit certain elements of the stacked image sensor 400 to avoid obscuring details of the disclosure. In other words, not all elements of the stacked image sensor 400 may be labeled, illustrated, or otherwise shown within FIG. 4 or other figures throughout the disclosure.

The stacked chip scheme of the stacked image sensor 400 illustrated in FIG. 4 distributes components across multiple substrates. Specifically, the semiconductor substrate 401 includes photosensitive elements (e.g., a plurality of photodiodes such as pinned photodiodes or the like to form pixels as illustrated in FIG. 2A) included in the active pixel array 405 while the second semiconductor substrate 451 includes pixel cell circuitry 455 associated with the active pixel array 405 (e.g., any one of or a combination of pixel transistors such as reset transistors, source-follower transistors, row select transistors, switchable conversion gain transistors, and so on, analog to digital circuitry, signal processing circuitry, or other circuitry to facilitate imaging an external scene with the pixels included in the active pixel array 405). Put in another way, the second semiconductor substrate 451 offloads at least part of the circuitry associated with the active pixel array 405 from the semiconductor substrate 401, which advantageously provides additional space on the semiconductor substrate 401 (e.g., to reduce pixel pitch, increase photodiode sensing area relative to total pixel area, and so on).

In some embodiments, the active pixel array 405 may be coupled to the pixel cell circuitry 455 through one or more hybrid bonds, through-silicon vias, other suitable circuitry coupling technologies, or combinations thereof. In some embodiments, the space saved on the semiconductor substrate 401 by offloading circuitry to the second semiconductor substrate 451 (or other subsequent substrates in the stacked chip scheme) may be repurposed to increase the size of individual photodiodes included in each individual pixel included in the active pixel array 405 to allow for increased pixel size, density, sensitivity, full well capacity, combinations thereof, or the like. Additionally, or alternatively, functionality of the stacked image sensor 400 may be facilitated as the second semiconductor substrate 451 may have room for additional components or circuitry that may not otherwise fit on an individual substrate that contains both the active pixel array 405 and the pixel cell circuitry 455 without affecting the performance and/or functionality of the stacked image sensor 400.

In the illustrated embodiment, the second semiconductor substrate 451 is coupled to the semiconductor substrate 401 to form the stacked semiconductor device. The semiconductor substrate 401 includes the active pixel array 405, which are arranged in rows (e.g., R1, R2, R3, . . . . RY) and columns (e.g., C1, C2, C3, . . . . CX) to form an array of pixel cells and a peripheral region 404, which may include, inter alia, an optical structure (e.g., illustrated in FIGS. 1A-2B) to mitigate stray light.

Embodiments of the disclosure illustrated in at least FIGS. 1A-2F and FIG. 4 may utilize conventional semiconductor device processing and microfabrication techniques known by one of ordinary skill in the art, which may include, but is not limited to, photolithography, ion implantation, chemical vapor deposition, physical vapor deposition, thermal evaporation, sputter deposition, reactive-ion etching, plasma etching, wafer bonding, chemical mechanical planarization, and the like. It is appreciated that the described techniques are merely demonstrative and not exhaustive and that other techniques may be utilized to fabricate one or more components of various embodiments of the disclosure.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:

a plurality of pixels arranged to form an active pixel array, wherein the plurality of pixels includes a plurality of photodiodes formed within a semiconductor substrate and configured to generate image charge in response to incident light;

a plurality of contact pads disposed within a peripheral region of the image sensor, the peripheral region surrounding the active pixel array;

an optical structure disposed on the semiconductor substrate within the peripheral region between the plurality of contact pads and the active pixel array, wherein the optical structure is adapted to mitigate stray light from reaching the active pixel array; and a metal shield disposed within the peripheral region proximate to a first side of the semiconductor substrate, wherein the metal shield is disposed between the first side of the semiconductor substrate and the optical structure.

2. The image sensor of claim 1, wherein the metal shield includes a first metal having a metal refractive index, wherein the optical structure includes a first material having a first refractive index less than the metal refractive index of the first metal.

3. The image sensor of claim 2, further comprising a low-refractive-index material disposed between the optical structure and the metal shield, wherein the first refractive index of the first material is greater than a corresponding refractive index of the low-refractive-index material.

4. The image sensor of claim 3, wherein the optical structure is a multi-layer stacked structure including a first layer of the first material and a second layer of a second material having a second refractive index less than the metal refractive index of the first metal but greater than the corresponding refractive index of the low-refractive-index material.

5. The image sensor of claim 1, wherein the optical structure includes a plurality of islands, and wherein a low-refractive-index material is disposed between the plurality of islands and the metal shield.

6. The image sensor of claim 5, wherein adjacent islands included in the plurality of islands are separated from one another by the low-refractive-index material.

7. The image sensor of claim 5, wherein the metal shield includes a first metal having a metal refractive index, wherein individual islands included in the plurality of islands of the optical structure each include a first material having a first refractive index less than the metal refractive index of the first metal but greater than a corresponding refractive index of the low-refractive-index material.

8. The image sensor of claim 6, wherein the adjacent islands are separated from one another by a first separation distance, wherein the adjacent islands are separated from the metal shield by a second separation distance, and wherein the first separation distance is greater than a combination of a thickness of the adjacent islands and the second separation distance.

9. The image sensor of claim 5, wherein individual islands included in the plurality of islands are arranged in rows and columns and are further positioned to laterally surround, at least in part, the active pixel array.

10. The image sensor of claim 9, wherein adjacent rows included in the rows or adjacent columns included in the columns are not aligned to configure the plurality of islands to form an offset island pattern.

11. The image sensor of claim 5, further comprising a plurality of light attenuation structures disposed proximate to the first side of the semiconductor substrate, wherein the plurality of light attenuation structures are further disposed between the plurality of photodiodes and a plurality of color filters included in the plurality of pixels of the active pixel array, and wherein individual islands included in the plurality of islands of the optical structure and individual attenuation structures included in the plurality of light attenuation structures each correspond to a multi-layer stacked structure including a first layer of a first material and a second layer of a second material.

12. The image sensor of claim 11, wherein (i) the first layer of the first material included in the individual islands is coplanar, at least in part, with the first layer of the first material included in the individual attenuation structures or (ii) the second layer of the second material included in the individual islands is coplanar, at least in part, with the second layer of the second material included in the individual attenuation structures.

13. The image sensor of claim 5, further comprising a plurality of light attenuation structures disposed proximate to the first side of the semiconductor substrate, wherein the plurality of light attenuation structures are further disposed between the plurality of photodiodes and a plurality of color filters included in the plurality of pixels of the active pixel array, wherein individual attenuation structures included in the plurality of light attenuation structures and individual islands included in the plurality of islands of the optical structure are aligned, at least in part, along a common plane.

14. The image sensor of claim 13, wherein the plurality of pixels include first pixels and second pixels different from the first pixels such that the active pixel array has a split-pixel architecture, wherein the plurality of light attenuation structures are optically aligned to be disposed between first photodiodes included in the plurality of photodiodes associated with the first pixels and corresponding optically aligned color filters included in the plurality of color filters such that the second pixels are more sensitive to incident light than the first pixels.

15. The image sensor of claim 5, further comprising, a transparent cover extending over the active pixel array and the optical structure, wherein the optical structure is disposed between the transparent cover and the metal shield, and wherein individual islands included in the plurality of islands of the optical structure are each completely encapsulated by the low-refractive-index material.

16. The image sensor of claim 5, wherein the optical structure is a monolithic structure patterned to form a plurality of openings, each opening included in the plurality of openings filled with the low-refractive-index material to form the plurality of islands such that the optical structure is segmented to form a plurality of regions of a first material separated by individual islands of the low-refractive-index material included in the plurality of islands, and wherein the plurality of regions of the first material have a first refractive index greater than a corresponding refractive index of the low-refractive-index material but less than a metal refractive index of a first metal included in the metal shield.

17. The image sensor of claim 1, wherein the optical structure is a monolithic structure having a first dimension greater than a second dimension of the active pixel array, wherein the first dimension and the second dimension extend along a common direction.

18. The image sensor of claim 1, further comprising at least one of peripheral circuitry, an array of dummy pixels, or an array of black reference pixels disposed within the peripheral region of the image sensor between the plurality of contact pads and the active pixel array, wherein the metal shield is disposed between the optical structure and at least one of the peripheral circuitry, the array of dummy pixels, or the array of black reference pixels.

19. An image sensor, comprising:

a plurality of pixels arranged to form an active pixel array, wherein the plurality of pixels includes a plurality of photodiodes formed within a semiconductor substrate;

an optical structure disposed within a peripheral region of the image sensor, the peripheral region surrounding the active pixel array; and a metal shield disposed within the peripheral region proximate to a first side of the semiconductor substrate, wherein the metal shield is disposed between the first side of the semiconductor substrate and the optical structure, wherein the optical structure is segmented to form a plurality of regions of a first material separated by a low-refractive-index material, and wherein the plurality of regions of the first material have a first refractive index greater than a corresponding refractive index of the low-refractive-index material but less than a metal refractive index of a first metal included in the metal shield.

* * * * *